(12) United States Patent
Zaghloul et al.

(10) Patent No.: US 6,462,711 B1
(45) Date of Patent: Oct. 8, 2002

(54) MULTI-LAYER FLAT PLATE ANTENNA WITH LOW-COST MATERIAL AND HIGH-CONDUCTIVITY ADDITIVE PROCESSING

(75) Inventors: Amir Ibrahim Zaghloul, Bethesda, MD (US); Eric Christopher Kohls, Washington, DC (US)

(73) Assignee: Comsat Corporation, Clarksburg, MD (US)

( * ) Notice: Subject to any disclaimer, the term of this patent is extended or adjusted under 35 U.S.C. 154(b) by 0 days.

(21) Appl. No.: 09/822,262

(22) Filed: Apr. 2, 2001

(51) Int. Cl.$^7$ ................................................. H01Q 1/38
(52) U.S. Cl. ................................. 343/700 MS; 29/600
(58) Field of Search .......................... 343/700 MS, 846, 343/848; 29/600; H01Q 1/38

(56) References Cited

U.S. PATENT DOCUMENTS

| | | | |
|---|---|---|---|
| 4,418,541 A | 12/1983 | Russell | 60/667 |
| 4,780,723 A | 10/1988 | Mead | 343/700 MS |
| 4,829,309 A * | 5/1989 | Tsukamoto et al. | 343/700 MS |
| 5,309,163 A | 5/1994 | Ngan et al. | 343/700 MS |
| 5,355,143 A | 10/1994 | Zurcher et al. | 343/700 MS |
| 5,488,380 A | 1/1996 | Harvey et al. | 342/368 |
| 5,650,788 A | 7/1997 | Jha | 343/700 MS |
| 5,708,679 A * | 1/1998 | Fernandes et al. | 343/700 MS |
| 5,763,058 A | 6/1998 | Isen et al. | 428/209 |
| 5,914,960 A | 6/1999 | Rauhala et al. | 370/468 |
| 6,165,386 A * | 12/2000 | Endo et al. | 252/500 |

* cited by examiner

*Primary Examiner*—Hoanganh Le
(74) *Attorney, Agent, or Firm*—Sughrue Mion, PLLC

(57) ABSTRACT

The invention is a multi-layer printed circuit antenna and a method for developing the antenna for which a screen printing technology is used to deposit conducting material forming the circuit layout directly on low-cost dielectric material, followed by a post-processing step performed on the printed circuit to increase circuit conductivity. In one embodiment, the dielectric material used is a thin layer supported by low-loss, foam-like material for spacing between the antenna layers. In another embodiment, a thick high-density, low-cost low-loss dielectric material acts as both the printing surface and the spacer between the antenna layers. The thick high-density, low-cost low-loss dielectric material allows for saving one layer in every printed circuit. The screen printing or additive process is less expensive than its etching or subtractive counterpart due to the process itself and due to the lower cost of materials. The post-processing of the printed circuit achieves the same level of conductivity as the more expensive etching technique. This allows for low-cost manufacturing for printed circuit antennas for use in, for example, DBS, DTH/TV, MMDS, LMDS and other wireless communications systems.

44 Claims, 5 Drawing Sheets

Multi-layer Flat Plate Antenna Using Screen
Printing Process on a Thick Low-loss Dielectric Material

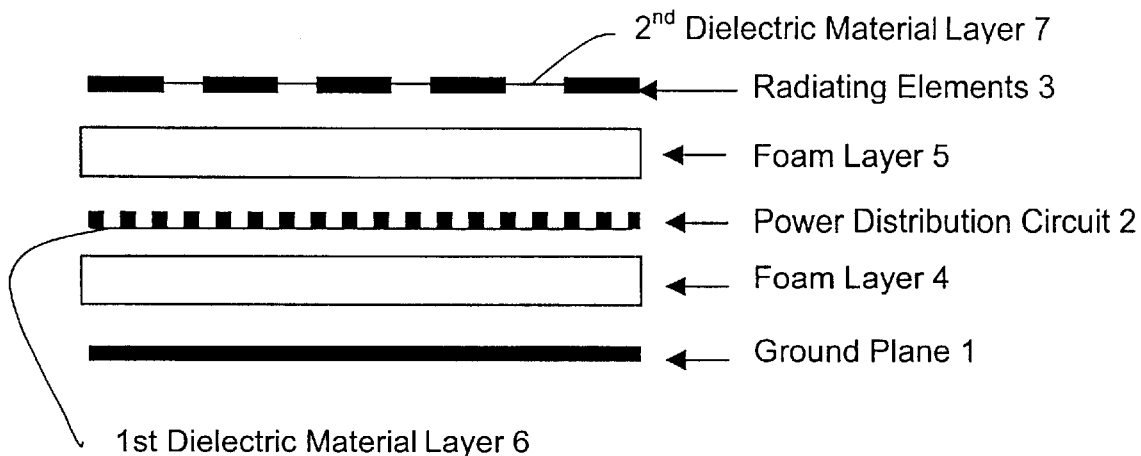
Figure 1. Multi-layer Flat Plate Antenna
PRIOR ART
Figure 2. Etching Process for Realizing the Radiating Elements and Power Distribution Circuit
PRIOR ART

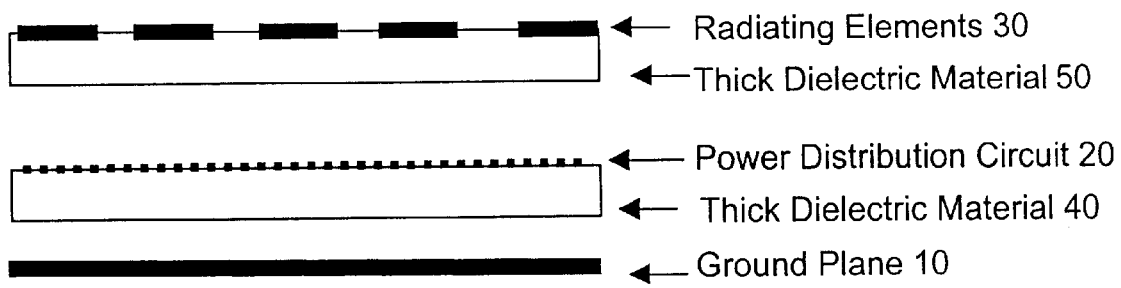
Figure 3. Multi-layer Flat Plate Antenna Using Screen Printing Process on a Thick Low-loss Dielectric Material
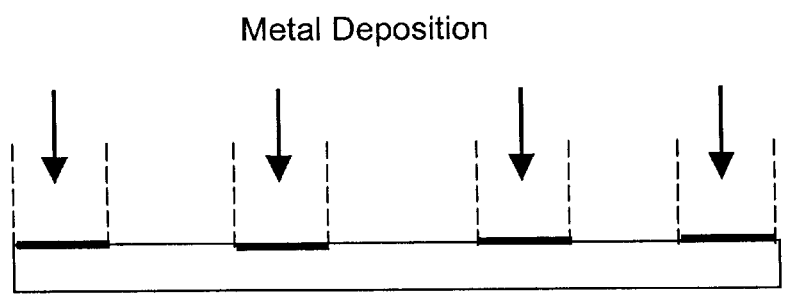
Figure 4. Realization of Circuits Using Screen Printing Process

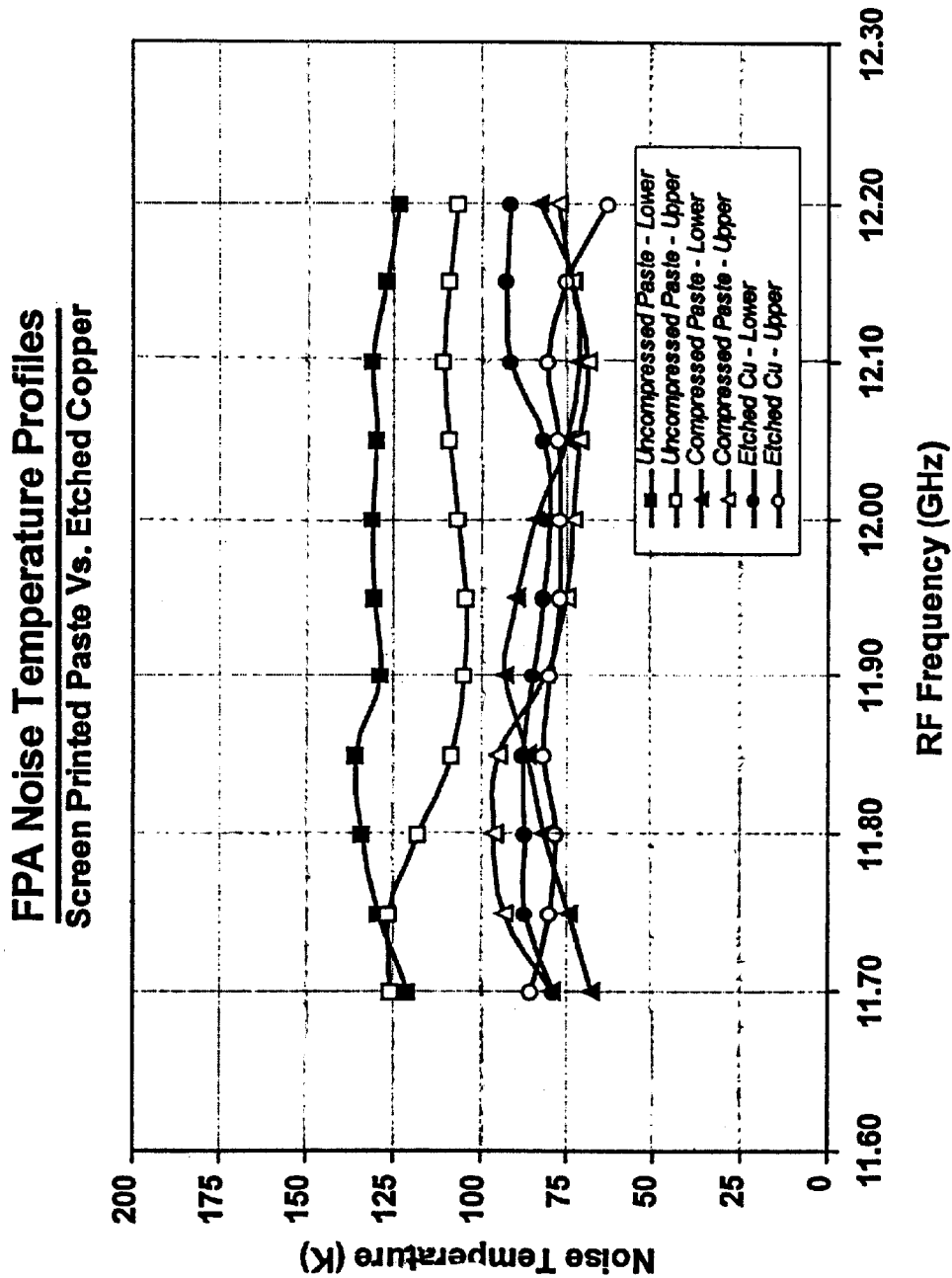
Figure 5 Noise Temperature Comparison between Etched Copper, Screen Printing without Compression and Screen Printing with Compression

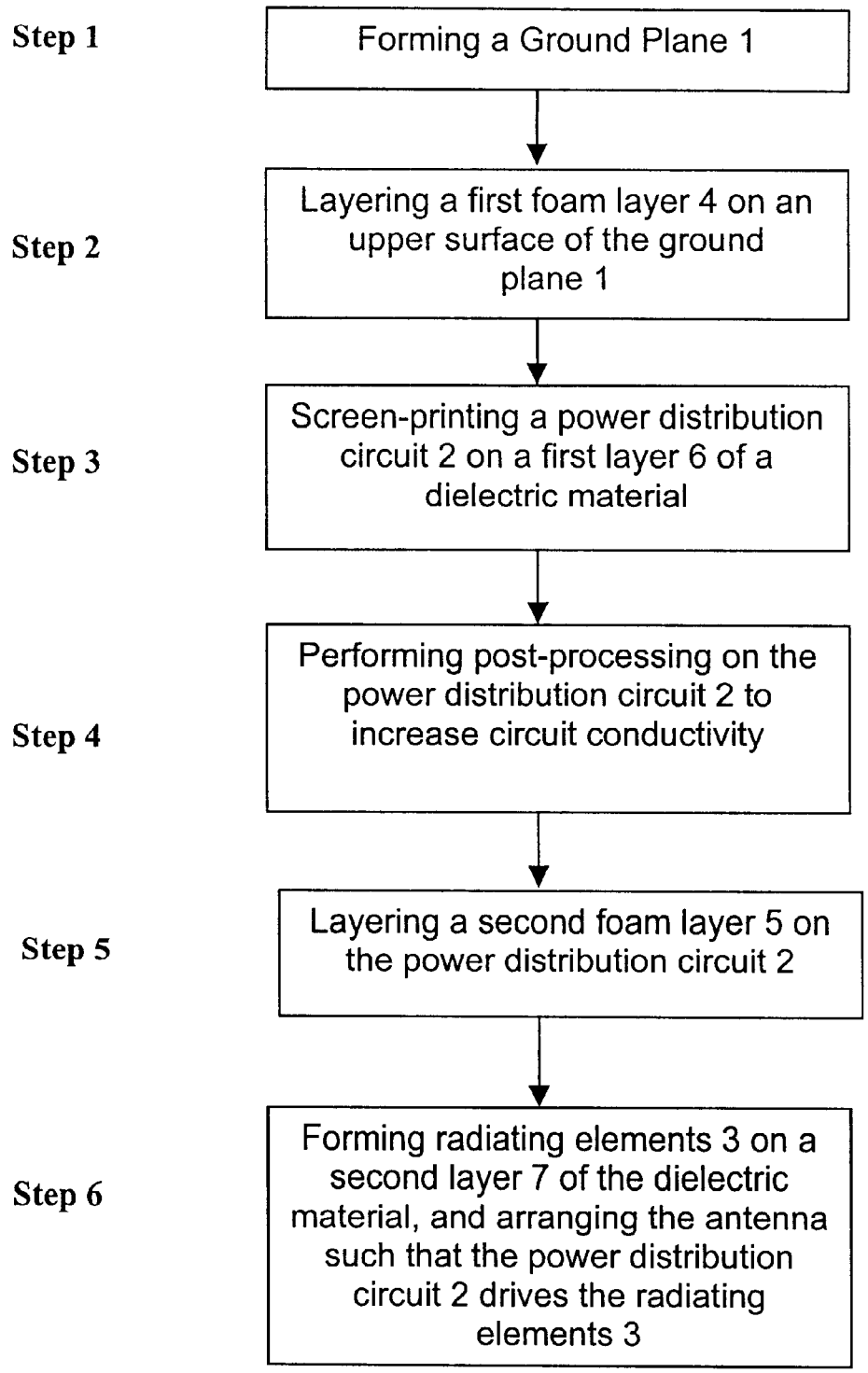
Figure 6. Method for Developing a Multi-layer Flat Plate Antenna According to a First Embodiment.

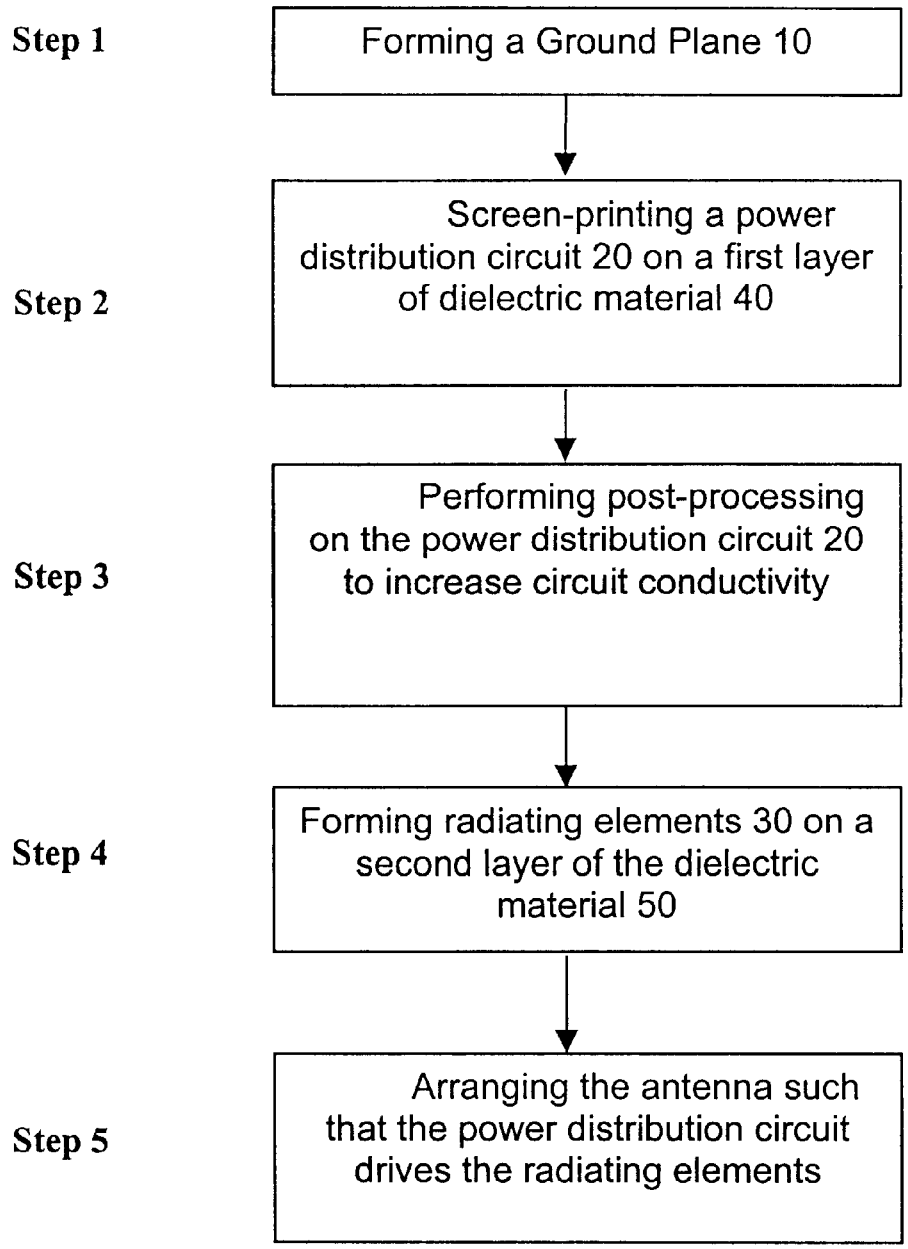
Figure 7. Method for Developing a Multi-layer Flat Plate Antenna According to a Second Embodiment.

MULTI-LAYER FLAT PLATE ANTENNA WITH LOW-COST MATERIAL AND HIGH-CONDUCTIVITY ADDITIVE PROCESSING

BACKGROUND OF THE INVENTION

1. Field of Invention

The present invention relates to a multi-layer printed circuit antenna in which a screen printing technology is used to deposit the conducting material forming the circuit layout directly on a low-cost dielectric material. The dielectric material used may be a thin layer supported by low-loss, foam-like material for spacing between antenna layers, or a thick, high-density, low-loss dielectric material acting as both the printing surface and the spacer between the antenna layers. The use of a thick dielectric eliminates the need to produce and apply one layer of the foam-like material for every printed circuit.

The use of a screen printing, or an additive process, is less expensive than an etching process or a subtractive counterpart, due to the particular steps in the process itself, and the lower cost of materials.

2. Related Art

Flat plate antennas using multi-layer printed circuit designs have been available as a consumer product for over a decade for DBS systems or direct to home TV systems (DTH/TV). They also have applications in MMDS, LMDS and other wireless communications links. The size of such antennas depends on the application, but it may range from 6 inches square to 30 inches square, with one set of continuous layers. The size can be larger for coplanar layers connected with a power combining network. The shape of the planar aperture can be square, rectangle, or other arbitrary shape.

Among the key elements in antenna costs are the materials and processing costs. Typically, the cost of an antenna is dependent on its size. The size of the antenna also determines the antenna losses and aperture efficiency. Improving the material characteristics of the antenna will lower the losses and allow for reduction of antenna size for the same performance, which in turn reduces the cost.

Competing designs to the multi-layer flat plate antenna include the conventional reflector system and waveguide-based flat plate antennas. The conventional reflector system antenna is lower in cost, mainly because of the large volume of production that it enjoys. However, the multi-layer flat plate antenna can be cost competitive against the conventional reflector system antenna for smaller size designs, even at low volume production.

The waveguide-based flat plate designs use metal structures or metal-coated plastic structures. Both the metal and metal-coated plastic structures are more expensive to manufacture than a multi-layer flat plate antenna. The metal-coated plastic structures used in waveguide-based flat plate antennas sometimes also have temperature stability and reliability problems. Thus, the multi-layer flat plate antenna is superior to the conventional waveguide-based flat plate antenna.

A multi-layer flat plate antenna is illustrated in FIG. 1. The antenna comprises a ground plane 1, and a strip-line power distribution circuit 2 which feeds an array of printed or punched radiating elements 3. The radiating elements 3 can be slots, patches or other forms of apertures and are formed in a layer of dielectric material 7. The radiating elements 3 can also be punched or formed on a planar metal plate. The radiating elements 3 and dielectric material 7, function as the upper ground plane for the strip-line structure of the feeding circuit, power distribution circuit 2. The strip-line power distribution circuit 2, as shown in FIG. 1, is formed on a thin dielectric material layer 6 and supported on either side with foam-like material, forming foam layers 4 and 5.

The conventional way of constructing the antenna of FIG. 1 is to use a copper-clad Mylar or similar conducting-material-coated thin dielectric for forming the power distribution circuit 2, and in some cases, also for the radiating elements 3. A mask is made for the power distribution circuit, and in some cases, for the printed radiating elements, and is used to chemically etch away the unwanted metal of the metal-coated layer, leaving only the printed power distribution circuit or printed radiating elements.

FIG. 2 is a diagram illustrating unwanted metal being etched away from a metal-coated layer. However, one problem with producing an antenna using the etching process, is that the etching process is expensive compared to a screen-printing process. Another problem is that both the circuit dielectric material 6 and 7, and the supporting foam-like material 4 and 5, contribute to the losses of the circuit and, consequently, adversely affect the antenna gain and efficiency.

BRIEF SUMMARY OF THE INVENTION

It is an object of the present invention to overcome the foregoing problems. In particular, it is an object of the present invention to replace the etching process of the relatively expensive metal-coated dielectric layer by screen printing directly on a less expensive dielectric layer.

It is a further object of the present invention to provide an antenna, and a method for manufacturing an antenna, which uses direct screen printing on a less expensive, clear dielectric layer, as opposed to etching conducting material from a more expensive, copper-coated dielectric material.

It is another object of the invention to provide an antenna, and a method for manufacturing an antenna, in which screen-printing is conducted directly on a thick, low-loss dielectric material, thus eliminating the support layers between printed circuit layers, and providing rigidity to the overall structure.

Yet another object of the invention is to provide an antenna, and a method for manufacturing an antenna, wherein the conductivity is increased, and consequently a higher gain and higher efficiency antenna is produced by combining the screen-printing technique with a post-processing step of compressing the screen-printed layers of the multi-layer flat antenna.

An additional object of the invention is to provide an antenna, and a method for manufacturing an antenna wherein the conductivity is increased, and consequently a higher gain and higher efficiency antenna is produced by combining the screen-printing technique with a post-processing step of depositing a highly conductive paste or electroplating a highly conductive material on the screen-printed circuits and ground plane area of the antenna.

These and other objects may be achieved in accordance with the present invention.

BRIEF DESCRIPTION OF THE DRAWINGS

FIG. 1 is a diagram illustrating in cross-section, a conventional Multi-layer Flat Plate Antenna.

FIG. 2. is a diagram illustrating unwanted metal being etched away from a metal-coated layer, to realize radiating elements and a power distribution circuit.

FIG. 3 is a diagram illustrating an antenna made according to the principles of the present invention and developed by screen-printing, in which thick, high-density, low loss material acts as both the printing surface for the circuit elements, and as a spacer between the circuit elements and a ground plane.

FIG. 4 is a diagram depicting the screen-printing process used for making the power distribution circuit and radiating elements of an antenna made according to the principle of the present invention.

FIG. 5 is a chart comparing noise temperature among antennas manufactured using these processes: etched copper, screen printing without compression, and screen printing with compression.

FIG. 6 is a flowchart providing the steps for producing an antenna according to a first embodiment of the invention.

FIG. 7 is a flowchart providing the steps for producing an antenna according to a second embodiment of the invention.

DETAILED DESCRIPTION OF THE PREFERRED EMBODIMENT

The present invention replaces the etching process of the relatively expensive metal-coated dielectric layer by screen printing directly on a less expensive dielectric layer, followed by a post-processing step. Referring back to FIG. 1, a first embodiment of the present invention uses a screen-printing process for making the power distribution circuit 2 and radiating elements 3 of the antenna. FIG. 4 is a diagram depicting the manner in which the screen-printing process is used to make the power distribution circuit and radiating elements. Specifically, FIG. 4 shows metal being deposited by screen-printing directly on a dielectric layer, instead of using the etching process.

A method for producing an antenna according to the first embodiment is illustrated in the flowchart of FIG. 6. The physical elements and numbering of FIG. 1 are used in the method shown in FIG. 6. First, a ground plane 1 is formed (step 1). Next, a first foam layer 4 is layered on an upper surface of the ground plane 1 (step 2). A power distribution circuit 2 is screen-printed on a first layer of a dielectric material 6 (step 3), and post-processing is performed on the power distribution circuit 2 to increase circuit conductivity (step 4). A second foam layer 5 is then layered on the power distribution circuit 2 (step 5). Radiating elements 3 are formed on a second layer of the dielectric material 7, and the antenna is arranged such that the power distribution circuit 2 drives the radiating elements 3 (step 6). In a preferred embodiment, the radiating elements 3 are also formed by screen-printing.

A second embodiment of the invention is shown in FIG. 3. In this embodiment, the thin dielectric material 4, 6, and the supporting foam-like material 6, 7 used in the first embodiment shown in FIG. 1, is replaced with a thick, low-loss dielectric material 40, 50 that has a dielectric constant close to 1. The thick dielectric material 40, 50 acts as a plate for the screen-printed power distribution circuit 20 and the radiating elements 30 respectively, as well as a spacer for the strip-line structure.

A method for producing this type of antenna is shown in the flowchart of FIG. 7. The physical elements and numbering of FIG. 3 are used in the method shown in FIG. 7. First, a ground plane 10 is formed (step 1). A power distribution circuit 20 is screen-printed on a first layer of dielectric material 40 (step 2), and post-processing is performed on the power distribution circuit 20 to increase circuit conductivity (step 3). Radiating elements 30 are formed on a second layer of dielectric material 50 (step 4), and the antenna is arranged such that the power distribution circuit drives the radiating elements (step 5). In another preferred embodiment, the radiating elements 30 are formed by screen-printing, and the dielectric material 40, 50 is a thick, high-density, low-loss material, acting as a forming surface for the power distribution circuit and the radiating elements, and acting as a spacer between the power distribution circuit and the ground plane, and between the power distribution circuit and the radiating elements.

In all embodiments, post-processing follows the screen printing step to increase the conductivity of the power distribution circuit and radiating elements, and thus increase the antenna gain and efficiency. This post-processing step can be in the form of pressing the circuit to reduce the gaps or bubbles between the metal particles on the transmission lines and on the conducting planes, which in turn, has the effect of increasing their conductivity. Or, another form of increasing the conductivity is by depositing a highly conductive paste or electroplating a highly conductive material on the circuit elements. Variations of the processes can also be used to alternate layers of the power distribution circuit with layers of radiating elements to form, for example, Dual Polarization and Dual Band antennas.

FIG. 5 shows measured data comparing the performance of antennas using etched circuits, screen-printed circuits and screen-printed circuits with post-processing compression. The antenna noise temperature (°K.), which is an indication of the conduction and dielectric losses as well as the antenna beam width and gain, is shown. Low temperatures indicate lower losses and better overall performance.

The results, as shown in FIG. 5, indicate that the antenna with the compressed screen-printed power dividing circuit on regular foam material has a performance similar to the antenna that uses the etched power dividing circuit. The antenna with the regular screen-printing, and no post-processing step performed, has a higher noise temperature, indicating higher losses. Modeled performance of the antenna using a direct screen printing on a special material which replaces the thin dielectric and foam layers also show higher gain for the same aperture size.

Thus, by depositing the conducting material forming the circuit layout directly on a low-cost dielectric material using a screen-printing process, followed by a post-processing step performed on the printed circuit to increase circuit conductivity, a low-cost, multi-layer printed circuit antenna can be manufactured. In addition, rigidity can be provided to the antenna by screen-printing directly on a thick dielectric material, thus eliminating support layers. The present invention has applications in, for example, direct broadcast satellite (DBS) terminals, Local Multipoint Distribution Service (LMDS) terminals, Multichannel Multipoint Distribution System (MMDS) terminals, and other terminals for wireless, satellite and ground based systems.

While the present invention has been described with what presently is considered to be the preferred embodiments, the claims are not to be limited to the disclosed embodiments. Variations can be made thereto without departing from the spirit and scope of the invention.

What is claimed is:

1. A method for producing a multi-layer flat plate antenna comprising the steps of:

(a) forming a ground plane;

(b) layering a first foam layer on an upper surface of said ground plane;

(c) screen-printing the conductive material of a power distribution circuit on a first layer of a dielectric material, said first layer of said dielectric material placed on an upper surface of said first foam layer;

(d) performing post-processing on said power distribution circuit to increase circuit conductivity;

(e) layering a second foam layer on said power distribution circuit;

(f) forming radiating elements on a second layer of said dielectric material, said second layer of said dielectric material placed on an upper surface of said second foam layer;

(g) arranging said antenna such that said power distribution circuit drives said radiating elements.

2. The method for producing a multi-layer flat plate antenna according to claim 1, wherein each layer of a plurality of layers of said power distribution circuit are alternatively layered with each layer of a plurality of layers of said radiating elements, said each layer of said plurality of layers of said power distribution circuit and said each layer of said plurality of layers of said radiating elements having one layer of a spacing material in between.

3. The method for producing a multi-layer flat plate antenna according to claim 1, wherein said radiating elements are formed by screen-printing, and said post-processing is also performed on said radiating elements.

4. The method for producing a multi-layer flat plate antenna according to claim 3, wherein said post-processing comprises compression of said radiating elements.

5. The method for producing a multi-layer flat plate antenna according to claim 3, wherein said post-processing step comprises depositing a highly conductive material on said radiating elements.

6. The method for producing a multi-layer flat plate antenna according to claim 1, wherein said radiating elements are punched or formed on a planar metal plate.

7. The method for producing a multi-layer flat plate antenna according to claim 1, wherein said dielectric material is a thin layer material.

8. The method for producing a multi-layer flat plate antenna according to claim 1, wherein said spacing material is low-loss, foam-like material.

9. The method for producing a multi-layer flat plate antenna according to claim 1, wherein said post-processing comprises compression of said power distribution circuit.

10. The method for producing a multi-layer flat plate antenna according to claim 1, wherein said post-processing comprises depositing a highly conductive material on said power distribution circuit.

11. The method for producing a multi-layer flat plate antenna according to claim 1, wherein a highly conductive material is deposited on said ground plane.

12. A method for producing a multi-layer flat plate antenna comprising the steps of:

(a) forming a ground plane;

(b) screen-printing the conductive material of a power distribution circuit on a top surface of a first layer of a dielectric material, and placing a bottom surface of said first layer of said dielectric material on an upper surface of said ground plane;

(c) performing post-processing on said power distribution circuit to increase circuit conductivity;

(d) forming radiating elements on a top surface of a second layer of said dielectric material, and placing a bottom surface of said second layer of said dielectric material on said power distribution circuit;

(e) arranging said antenna such that said power distribution circuit drives said radiating elements.

13. The method for producing a multi-layer flat plate antenna according to claim 12, wherein each layer of a plurality of layers of said power distribution circuit are alternatively layered with each layer of a plurality of layers of said radiating elements, said each layer of said plurality of layers of said power distribution circuit and said each layer of said plurality of layers of said radiating elements separated by said dielectric material.

14. The method for producing a multi-layer flat plate antenna according to claim 12, wherein said radiating elements are formed by screen-printing and said post-processing is also performed on said radiating elements.

15. The method for producing a multi-layer flat plate antenna according to claim 14, wherein said post-processing comprises compression of said radiating elements.

16. The method for producing a multi-layer flat plate antenna according to claim 14, wherein said post-processing step comprises depositing a highly conductive material on said radiating elements.

17. The method for producing a multi-layer flat plate antenna according to claim 12, wherein said radiating elements are punched or formed on a planar metal plate.

18. The method for producing a multi-layer flat plate antenna according to claim 12, wherein said dielectric material is a thick, high-density, low-loss material, said thick, high-density, low-loss material acting as a forming surface for said power distribution circuit and said radiating elements, and acting as a spacer between said power distribution circuit and said ground plane, and between said power distribution circuit and said radiating elements.

19. The method for producing a multi-layer flat plate antenna according to claim 12, wherein said post-processing step comprises compression of said power distribution circuit.

20. The method for producing a multi-layer flat plate antenna according to claim 12, wherein said post-processing step comprises depositing a highly conductive material on said power distribution circuit.

21. The method for producing a multi-layer flat plate antenna according to claim 12, wherein a highly conductive material is deposited on said ground plane.

22. A multi-layer flat plate antenna comprising:

(a) a ground plane;

(b) a first layer of spacing material between said ground plane and a first layer of dielectric material;

(c) a power distribution circuit, wherein the conductive material of said power distribution circuit has been screen-printed on said first layer of dielectric material, and post-processed to increase circuit conductivity after said screen-printing;

(d) a second layer of spacing material between said power distribution circuit and a second layer of dielectric material; and (e) radiating elements formed on said second layer of dielectric material, wherein said power distribution circuit drives said radiating elements.

23. The multi-layer flat plate antenna according to claim 22, wherein each layer of a plurality of layers of said power distribution circuit are alternatively layered with each layer of a plurality of layers of said radiating elements, said each layer of said plurality of layers of said power distribution circuit and said each layer of said plurality of layers of said radiating elements having one layer of said spacing material in between.

24. The multi-layer flat plate antenna according to claim 22, wherein said radiating elements are formed by screen-printing, and post-processed after said screen-printing.

25. The multi-layer flat plate antenna according to claim 24, wherein said post-processed radiating elements comprise compressed radiating elements.

26. The multi-layer flat plate antenna according to claim 24, wherein said post-processed radiating elements comprises a highly conductive material deposited on said radiating elements.

27. The multi-layer flat plate antenna according to claim 22, wherein said radiating elements are punched or formed on a planar metal plate.

28. The multi-layer flat plate antenna according to claim 22, wherein said dielectric material is a thin layer material.

29. The multi-layer flat plate antenna according to claim 22, wherein said spacing material is low-loss, foam-like material.

30. The multi-layer flat plate antenna according to claim 22, wherein said post-processed power distribution circuit comprises a compressed power distribution circuit.

31. The multi-layer flat plate antenna according to claim 22, wherein said post-processed power distribution circuit comprises a highly conductive material deposited on said power distribution circuit.

32. The multi-layer flat plate antenna according to claim 22, further comprising a highly conductive material deposited on said ground plane.

33. A multi-layer flat plate antenna comprising:
   (a) a ground plane;
   (b) a power distribution circuit, wherein the conductive material of said power distribution circuit has been screen-printed on a top surface of a first layer of dielectric material, and post-processed to increase circuit conductivity after said screen-printing, and a bottom surface of said first layer of dielectric material rests on an upper surface of said ground plane;
   (c) radiating elements formed on a top surface of a second layer of said dielectric material, wherein a bottom surface of said second layer of said dielectric material rests on said power distribution circuit, and said power distribution circuit drives said radiating elements.

34. The multi-layer flat plate antenna according to claim 33, wherein each layer of a plurality of layers of said power distribution circuit are alternatively layered with each layer of a plurality of layers of said radiating elements, said each layer of said plurality of layers of said power distribution circuit and said each layer of said plurality of layers of said radiating elements separated by said dielectric material.

35. The multi-layer flat plate antenna according to claim 33, wherein said radiating elements are formed by screen-printing, and post-processed after said screen-printing.

36. The multi-layer flat plate antenna according to claim 35, wherein said post-processed radiating elements comprise compressed radiating elements.

37. The multi-layer flat plate antenna according to claim 35, wherein said post-processed radiating elements comprise a highly conductive material deposited on said radiating elements.

38. The multi-layer flat plate antenna according to claim 33, wherein said radiating elements are punched or formed on a planar metal plate.

39. The multi-layer flat plate antenna according to claim 33, wherein said dielectric material is a thick, high-density, low-loss material, said thick, high-density, low-loss material acting as a forming surface for said power distribution circuit and said radiating elements, and acting as a spacer between said power distribution circuit and said ground plane, and between said power distribution circuit and said radiating elements.

40. The multi-layer flat plate antenna according to claim 33, wherein said post-processed power distribution circuit comprise a compressed power distribution circuit.

41. The multi-layer flat plate antenna according to claim 33, wherein said post-processed power distribution circuit comprises a highly conductive material deposited on said power distribution circuit.

42. The multi-layer flat plate antenna according to claim 33, further comprising a highly conductive material deposited on said ground plane.

43. A multi-layer flat plate antenna comprising:
   (a) a ground plane;
   (b) a first layer of spacing material between said ground plane and a first layer of dielectric material;
   (c) a power distribution circuit, wherein the conductive material of said power distribution circuit has been screen-printed on said first layer of dielectric material;
   (d) a second layer of spacing material between said power distribution circuit and a second layer of dielectric material; and
   (e) radiating elements formed on said second layer of dielectric material, wherein said power distribution circuit drives said radiating elements, and wherein at least one of said power distribution circuit or said radiating elements is post-processed to increase circuit conductivity.

44. A multi-layer flat plate antenna comprising:
   (a) a ground plane;
   (b) a power distribution circuit, wherein the conductive material of said power distribution circuit has been screen-printed on a top surface of a first layer of dielectric material, and a bottom surface of said first layer of dielectric material rests on an upper surface of said ground plane;
   (c) radiating elements formed on a top surface of a second layer of said dielectric material, wherein a bottom surface of said second layer of said dielectric material rests on said power distribution circuit, and said power distribution circuit drives said radiating elements, and wherein at least one of said power distribution circuit or said radiating elements is post-processed to increase circuit conductivity.

* * * * *